US010656482B2

(12) United States Patent
Kawabuchi et al.

(10) Patent No.: US 10,656,482 B2
(45) Date of Patent: May 19, 2020

(54) THIN-FILM TRANSISTOR SUBSTRATE AND LIQUID CRYSTAL DISPLAY

(71) Applicant: Mitsubishi Electric Corporation, Tokyo (JP)

(72) Inventors: Shinji Kawabuchi, Tokyo (JP); Naruhito Hoka, Tokyo (JP); Kazushi Yamayoshi, Tokyo (JP); Akihiko Hosono, Tokyo (JP); Kenichi Miyamoto, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 20 days.

(21) Appl. No.: 15/588,885

(22) Filed: May 8, 2017

(65) Prior Publication Data

US 2017/0329176 A1    Nov. 16, 2017

(30) Foreign Application Priority Data

May 13, 2016 (JP) .................................. 2016-096767

(51) Int. Cl.
*G02F 1/1362* (2006.01)
*H01L 27/12* (2006.01)
(Continued)

(52) U.S. Cl.
CPC .... *G02F 1/136209* (2013.01); *G02F 1/13439* (2013.01); *G02F 1/133345* (2013.01);
(Continued)

(58) Field of Classification Search
CPC ......... G02F 1/136209; G02F 1/134363; G02F 2001/134372; G02F 2001/121; H01L 29/78636
See application file for complete search history.

(56) References Cited

U.S. PATENT DOCUMENTS 6,016,174 A    1/2000 Endo et al.
6,356,330 B1 *    3/2002 Ando .................. G02F 1/13394
                                                     349/141
(Continued)

FOREIGN PATENT DOCUMENTS

JP    H10-268353 A    10/1998
JP    2002-296615 A    10/2002
(Continued)

OTHER PUBLICATIONS

Kenji Nomura, et al., "Room-temperature fabrication of transparent flexible thin-film transistors using amorphous oxide semiconductors," Nature, Nov. 25, 2004, pp. 488-492, vol. 432, Nature publishing Group.
(Continued)

*Primary Examiner* — Jessica M Merlin
(74) *Attorney, Agent, or Firm* — Studebaker & Brackett PC

(57) ABSTRACT

A channel layer is formed of an oxide semiconductor. A first insulating film is provided on the channel layer, a source line, and a drain electrode, and includes a drain contact hole which reaches the drain electrode. A pixel electrode is provided on the first insulating film, includes a connection conductive layer which is connected to the drain electrode by the drain contact hole, and is formed of a transparent conductive material. The pixel electrode is covered with a second insulating film. A common electrode is provided on the second insulating film, includes an opening which faces the pixel electrode in a thickness direction, and is formed of a transparent conductive material. A metal layer, in conjunction with a part of the common electrode, forms a laminated structure, and includes a light-shield part which overlaps the channel layer at least partially in plan view.

12 Claims, 9 Drawing Sheets

(51) Int. Cl.
  *H01L 29/786* (2006.01)
  *G02F 1/1333* (2006.01)
  *G02F 1/1335* (2006.01)
  *G02F 1/1337* (2006.01)
  *G02F 1/1343* (2006.01)
  *G02F 1/136* (2006.01)

(52) U.S. Cl.
  CPC .. *G02F 1/133512* (2013.01); *G02F 1/133788* (2013.01); *G02F 1/134309* (2013.01); *G02F 1/136227* (2013.01); *G02F 1/136286* (2013.01); *H01L 27/124* (2013.01); *H01L 27/1225* (2013.01); *H01L 29/78633* (2013.01); *G02F 2001/13606* (2013.01); *G02F 2001/134318* (2013.01); *G02F 2001/134372* (2013.01); *G02F 2001/136218* (2013.01); *G02F 2201/121* (2013.01); *G02F 2201/123* (2013.01); *H01L 29/7869* (2013.01)

(56) References Cited

U.S. PATENT DOCUMENTS

| | | | |
|---|---|---|---|
| 8,314,915 | B2 | 11/2012 | Ota |
| 8,941,201 | B2 | 1/2015 | Kita |
| 2002/0101557 | A1* | 8/2002 | Ono ................. G02F 1/134363 349/143 |
| 2009/0189153 | A1 | 7/2009 | Iwasaki et al. |
| 2014/0070211 | A1 | 3/2014 | Iwasaki et al. |
| 2014/0300852 | A1 | 10/2014 | Yoshida |
| 2015/0062451 | A1 | 3/2015 | Ono |
| 2015/0138481 | A1 | 5/2015 | Yamayoshi et al. |
| 2015/0160489 | A1* | 6/2015 | Kim ................. G02F 1/134309 349/139 |
| 2015/0206907 | A1* | 7/2015 | Hsu ..................... H01L 27/1255 349/43 |
| 2016/0062193 | A1 | 3/2016 | Yamayoshi et al. |
| 2018/0259809 | A1* | 9/2018 | Lee ....................... G02F 1/1343 |

FOREIGN PATENT DOCUMENTS

| | | |
|---|---|---|
| JP | 2005-077822 A | 3/2005 |
| JP | 2007-281409 A | 10/2007 |
| JP | 2009-151285 A | 7/2009 |
| JP | 2009-271389 A | 11/2009 |
| JP | 2010-008758 A | 1/2010 |
| JP | 2013-122536 A | 6/2013 |
| JP | 2015-049426 A | 3/2015 |
| JP | 2015-099287 A | 5/2015 |
| JP | 2016-051093 A | 4/2016 |
| WO | 2013/077262 A1 | 5/2013 |

OTHER PUBLICATIONS

An Office Action mailed by the Japanese Patent Office dated Feb. 18, 2020, which corresponds to Japanese Patent Application No. 2016-096767 and is related to U.S. Appl. No. 15/588,885.

* cited by examiner

F I G. 3
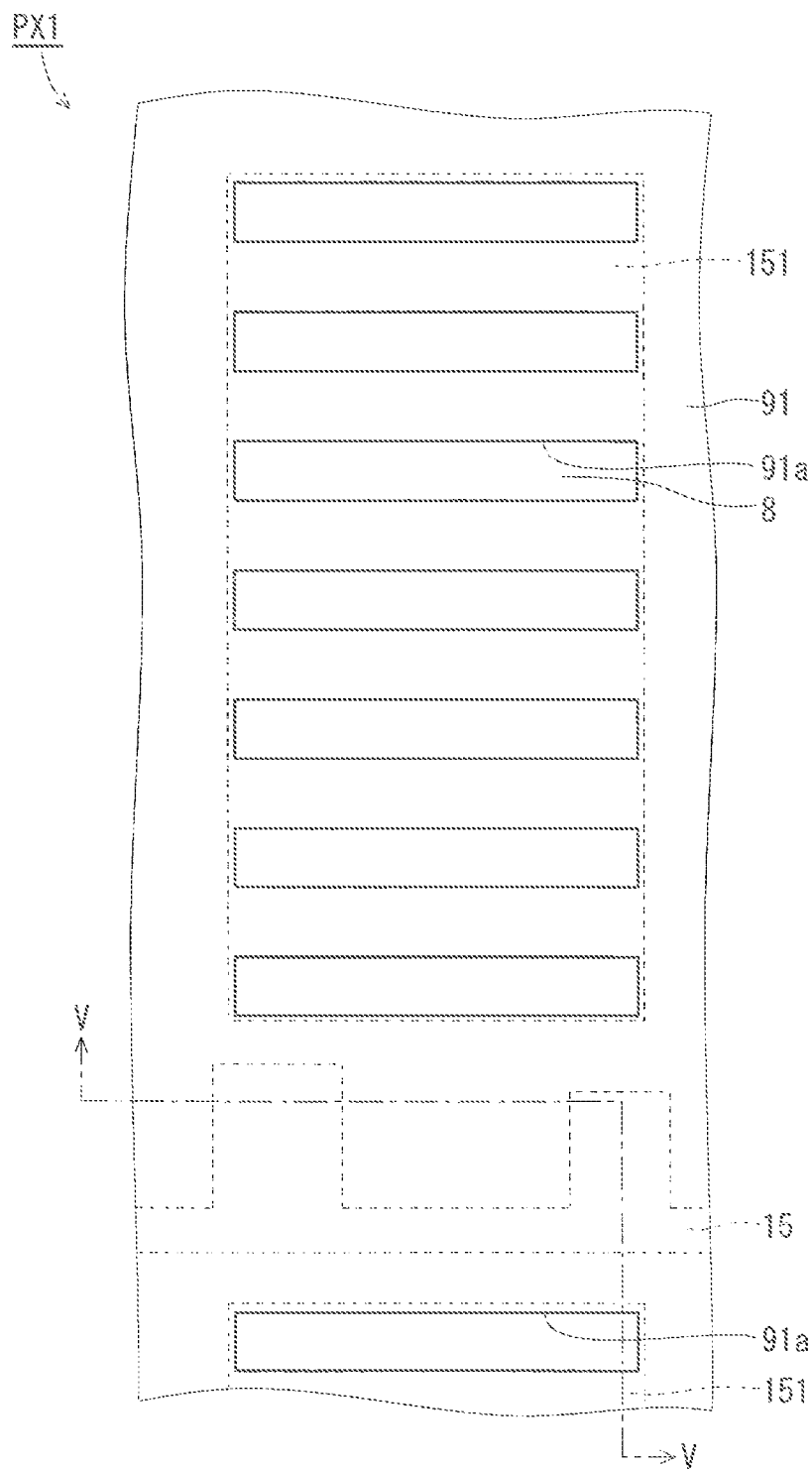

F I G . 4
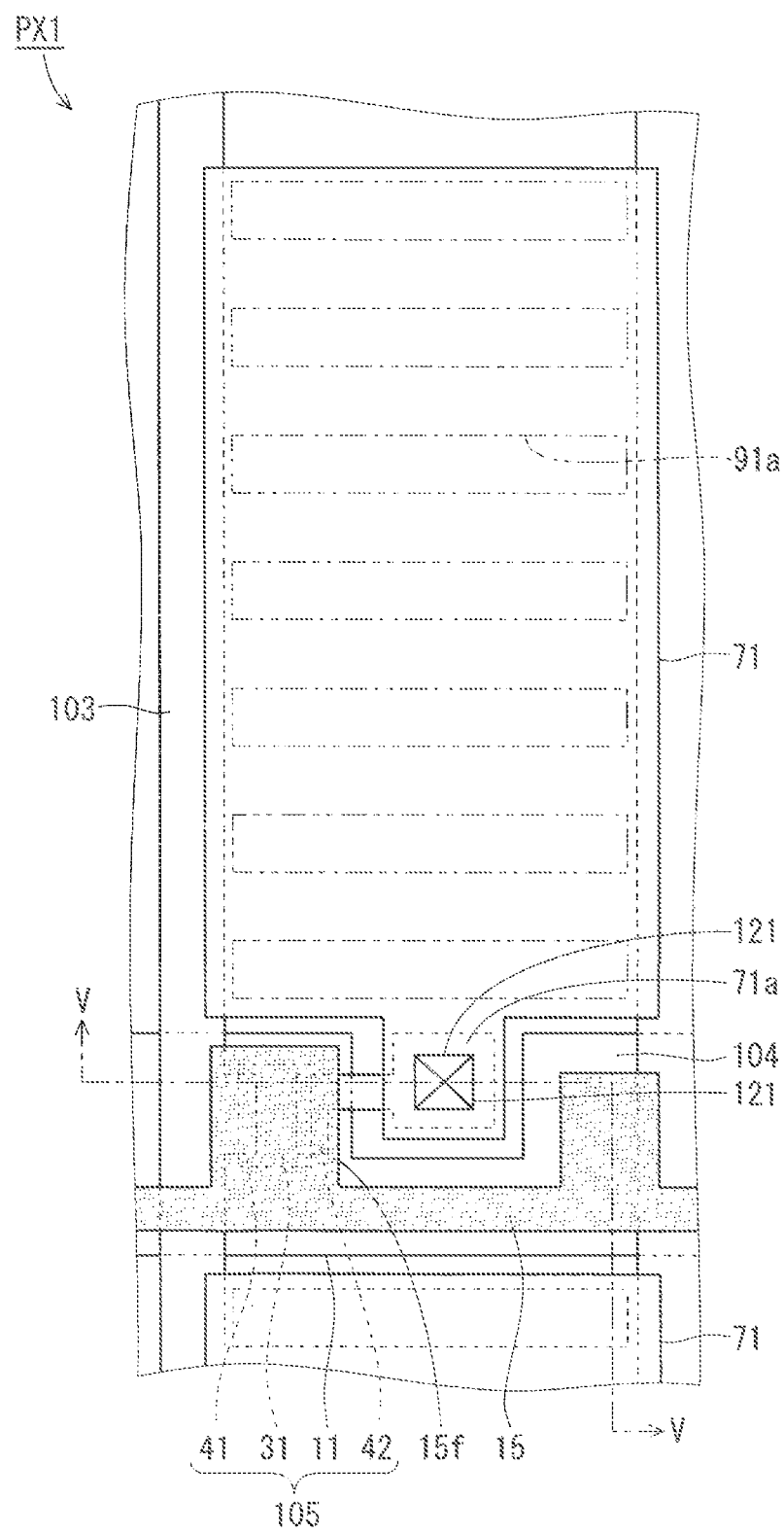

F I G. 7
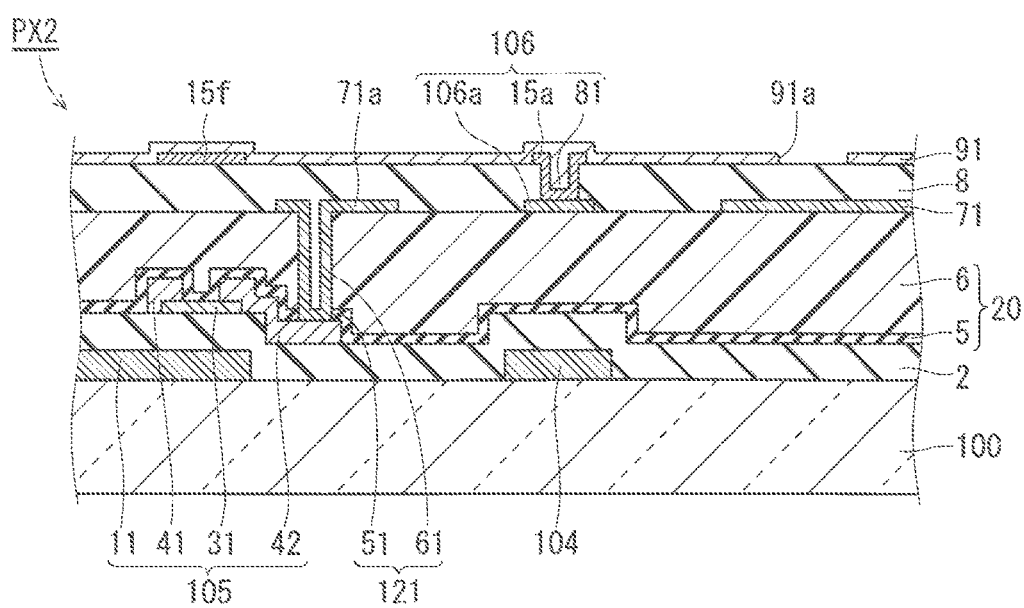

F I G . 1 1
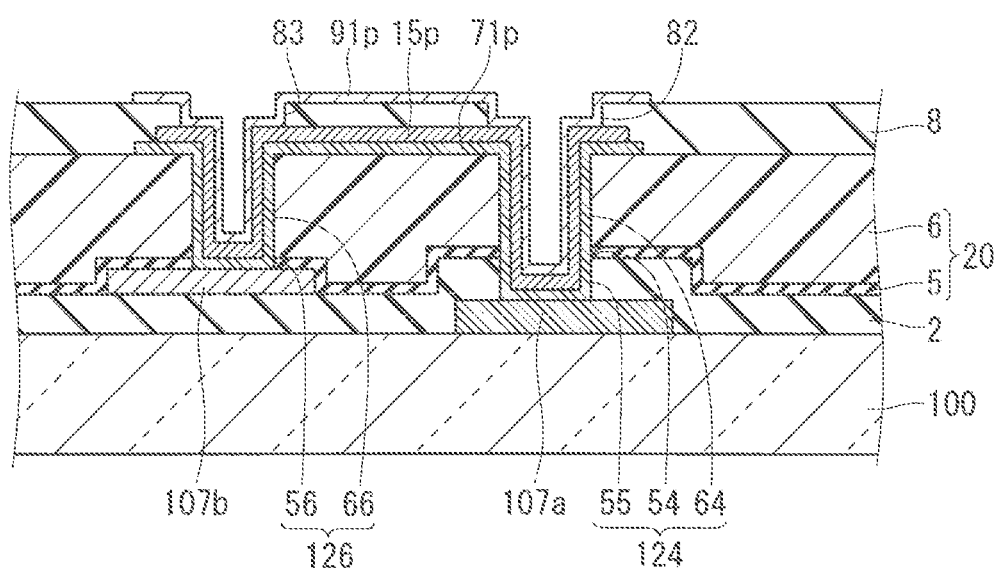

THIN-FILM TRANSISTOR SUBSTRATE AND LIQUID CRYSTAL DISPLAY

BACKGROUND OF THE INVENTION

Field of the Invention

The present invention relates to a thin-film transistor substrate and a liquid crystal display, and particularly to a thin-film transistor substrate and a liquid crystal display which use an oxide semiconductor.

Description of the Background Art

A TFT active matrix substrate (or a thin-film transistor substrate, which will hereinafter be referred to as a "TFT substrate") which uses a plurality of thin-film transistors (TFT) arranged in a matrix, as switching devices, is utilized in an electrooptical apparatus such as a display using liquid crystal (liquid crystal display which will hereinafter be also referred to as an "LCD"), or a display using a light emitting diode (LED) (light-emitting display), for example. As an LCD, a TFT-LCD using a TFT as a switching device and a simple matrix LCD are available, and a TFT-LCD is superior to a simple matrix LCD in display quality. For this reason, a TFT-LCD is widely used in display products including a mobile computer, a notebook-sized personal computer, a television, and the like. A TFT-LCD includes a TFT substrate, a counter substrate in which a color filter or the like is provided, and a liquid crystal layer held between those substrates. A polarizing plate is provided on each of a front surface and a back surface of the TFT-LCD, and a backlight is provided on an outside of either a front surface or a back surface of the TFT-LCD.

As a mode of driving liquid crystal in an LCD, a vertical electric field mode such as a twisted nematic (TN) mode or a vertical alignment (VA) mode, and a transverse electric field mode such as an in-plane switching (IPS) mode ("IPS" is a registered trademark) or a fringe field shielding (FFS) mode, are available. In a liquid crystal display for a vertical electric field mode typified by a TN mode, a pixel electrode to which a voltage corresponding to a pixel signal is applied is provided in a TFT substrate, and a common electrode kept at a constant potential (common potential) is provided in a counter substrate. Accordingly, liquid crystal in a liquid crystal layer is driven by an electric field which is substantially perpendicular to a surface of a liquid crystal display. On the other hand, in a liquid crystal display for a transverse electric field mode, both of a pixel electrode and a common electrode are provided in a TFT substrate. Liquid crystal in a liquid crystal layer is driven by an electric field which is substantially horizontal to a surface of a liquid crystal display. More specifically, in a TFT substrate for an FFS mode, a pixel electrode and a common electrode are placed so as to vertically face each other via an insulating layer. Either a pixel electrode or a common electrode can be placed on a lower side (farther from a liquid crystal layer). One of a pixel electrode and a common electrode which is placed on a lower side (a side farther from a liquid crystal layer) is formed into a plate-like shape, and the other which is placed on an upper side (a side closer to a liquid crystal layer) is formed into a grid shape having a slit or a comb-like shape. In general, a liquid crystal display for a transverse electric field mode is advantageous over a liquid crystal display for a vertical electric field mode in obtaining a wide viewing angle, and so is becoming predominant in a field of a display product such as a personal computer or an on-vehicle display equipment.

As a semiconductor material of a TFT substrate, amorphous silicon (a-Si) has been widely used so far. In such a situation, various modes of driving liquid crystal have been used. For example, Japanese Patent Application Laid-Open No. 10-268353 (1998) discloses a TFT substrate for a TN mode. Such a TFT substrate can be generally manufactured by five photoengraving processes of: (1) forming a gate electrode; (2) forming a gate insulating film and a channel layer; (3) forming a source electrode and a drain electrode; (4) forming a contact hole through a protective insulating film; and (5) forming a pixel electrode. Also, Japanese Patent Application Laid-Open No. 2009-151285, for example, discloses a TFT substrate for an FFS mode. Such a TFT substrate can be generally manufactured by seven photoengraving processes of: (1) forming a gate electrode; (2) forming a gate insulating film and a channel layer; (3) forming a source electrode and a drain electrode; (4) forming a contact hole through a protective insulating film; (5) forming a pixel electrode; (6) forming a contact hole through an interlayer insulating film; and (7) forming a common electrode.

A pixel electrode and a common electrode which are separated from a TFT by an insulating film are provided in each of pixel units of a TFT substrate for an FFS mode. An arbitrary signal (voltage) which is externally provided and indicates displayed information is applied to a pixel electrode from a signal line via a TFT and a contact hole formed in an insulating film. In this regard, an area actually used for displaying in a pixel unit (hereinafter, an area used for displaying in a pixel unit will be referred to as a "display-pixel area") is an area where a common electrode and a pixel electrode are superimposed. On the other hand, an area where a TFT, a contact hole, a signal line, and a scanning line are placed is an area which is not used for displaying (which will hereinafter be referred to as a "non-display-pixel area"). In a pixel unit, an increase of a proportion of a non-display-pixel area means a decrease of a proportion of a display-pixel area. That is, an increase of a proportion of a non-display-pixel area means reduction in aperture ratio. Reduction in aperture ratio hampers enhancement in definition of a display. Therefore, it is desired to minimize a non-display-pixel area.

In recent years, "Room-temperature fabrication of transparent flexible thin-film transistors using amorphous oxide semiconductors", Kenji Nomura et al, Nature 2004, Vol. 432, pp. 488-492 discloses usability of an oxide semiconductor as a semiconductor material of a TFT. An oxide semiconductor, which has higher mobility than conventionally-used a-Si, allows reduction in size of a TFT while maintaining a performance. Thus, an oxide semiconductor is advantageous in ensuring an aperture ratio stated above. For this reason, an oxide semiconductor is beginning to be applied to a portable equipment such as a smartphone or a mobile computer, a personal computer, and the like. As an oxide semiconductor, a zinc-oxide- (ZnO—) based material, or an amorphous InGaZnO-based material which is ZnO doped with a gallium oxide ($Ga_2O_3$) and an indium oxide ($In_2O_3$), is mainly used. The foregoing techniques are disclosed in Japanese Patent Application Laid-Open No. 2005-77822 and Japanese Patent Application Laid-Open No. 2007-281409, and the like, for example.

Generally, an oxide semiconductor is easily deteriorated due to light such as UV light. As such, it is conceived to prevent an influence of light incidence from above by provision of a film serving to block light above an oxide semiconductor. For example, according to Japanese Patent Application Laid-Open No. 2013-122536, a common electrode is provided on a TFT using an oxide semiconductor via an insulating film in a TFT substrate for an FFS mode. A light-shield conductor is provided on a part of the common electrode. Then, a pixel electrode formed of a transparent conductive material is provided on the light-shield conductor via another insulating film. The pixel electrode is connected to a drain electrode of the TFT via a contact hole passing through both of the insulating films. The light-shield conductor serves to not only block light as described above, but also reduce electrical resistance of an electrical path across the common electrode. Reduction in electrical resistance can lead to acquisition of more excellent image quality.

According to the above-described techniques in Japanese Patent Application Laid-Open No. 2013-122536, the common electrode is placed between the TFT and the pixel electrode formed of a transparent conductive material, in a thickness direction. Thus, an electrical path between the TFT and the pixel electrode is lengthened. Also, the foregoing electrical path is formed of a transparent conductive material, which has higher resistivity than resistivity of a metal material. Thus, electrical resistance of the electrical path is likely to increase. Due to that, defective displaying is likely to occur. To increase an area of a contact hole forming the electrical path allows reduction in electrical resistance on one hand. However, to do so results in an increase in an area of a non-display-pixel area. Consequently, an aperture ratio is reduced. As described above, in the conventional art, it is difficult to suppress occurrence of defective displaying while ensuring a sufficient aperture ratio.

SUMMARY OF THE INVENTION

The present invention has been made to solve the above-described problems, and it is an object of the present invention to provide a thin-film transistor substrate and a liquid crystal display which can suppress occurrence of defective displaying while ensuring an aperture ratio.

A thin-film transistor substrate according to one aspect of the present invention includes a display area having a plurality of pixels which are arranged in a matrix. The thin-film transistor substrate includes a supporting substrate, a gate line, a gate insulating film, a channel layer, a source line, a drain electrode, a first insulating film, a pixel electrode, a second insulating film, a common electrode, and a metal layer. The gate line is provided on the supporting substrate and includes a gate electrode placed in each of the pixels. The gate line is covered with the gate insulating film. The channel layer is provided on each of the gate electrodes via the gate insulating film and is formed of an oxide semiconductor. The source line is placed in each of the pixels and includes a source electrode which is in contact with the channel layer. The drain electrode is placed in each of the pixels, is in contact with the channel layer, and is distant from the source electrode. The first insulating film is provided on the channel layer, the source line, and the drain electrode, and includes a drain contact hole which reaches the drain electrode. The pixel electrode is provided on the first insulating film in each of the pixels, includes a connection conductive layer electrically connected to the drain electrode by the drain contact hole, and is formed of a transparent conductive material. The pixel electrode is covered with the second insulating film. The common electrode is provided on the second insulating film, includes an opening facing the pixel electrode in a thickness direction, and is formed of a transparent conductive material. The metal layer forms a laminated structure in conjunction with a part of the common electrode, and includes a light-shield part which overlaps the channel layer at least partially in plan view.

A thin-film transistor substrate according to another aspect of the present invention includes a display area having a plurality of pixels which are arranged in a matrix. The thin-film transistor substrate includes a supporting substrate, a gate line, a gate insulating film, a channel layer, a source line, a drain electrode, a first insulating film, a pixel electrode, a metal layer, a second insulating film, and a common electrode. The gate line is provided on the supporting substrate and includes a gate electrode placed in each of the pixels. The gate line is covered with the gate insulating film. The gate insulating film includes a first gate contact hole which reaches the gate line. The channel layer is provided on each of the gate electrodes via the gate insulating film and is formed of an oxide semiconductor. The source line is placed in each of the pixels and includes a source electrode which is in contact with the channel layer. The drain electrode is placed in each of the pixels, is in contact with the channel layer, and is distant from the source electrode. The first insulating film is provided on the channel layer, the source line, and the drain electrode, and includes a second gate contact hole which is joined to the first gate contact hole, and includes a drain contact hole which reaches the drain electrode. The pixel electrode is provided on the first insulating film in each of the pixels, includes a connection conductive layer electrically connected to the drain electrode by the drain contact hole, and is formed of a transparent conductive material. The metal layer is provided on a part of the first insulating film and includes a light-shield part which overlaps the channel layer at least partially in plan view. The pixel electrode and the metal layer are covered with the second insulating film. The common electrode is provided on the second insulating film, includes an opening facing the pixel electrode in a thickness direction, and is formed of a transparent conductive material. The metal layer is electrically connected to the gate line by the first gate contact hole and the second gate contact hole.

In the thin-film transistor substrate according to one aspect of the present invention, the common electrode need not be placed between the TFT and the pixel electrode formed of a transparent conductive material in a thickness direction. This can allow an electrical path between the TFT and the pixel electrode to be made shorter than that in a case where the common electrode is placed between the TFT and the pixel electrode. This can reduce an area of a contact hole forming the above-stated electrical path, while preventing electrical resistance of the electrical path from excessively increasing. Accordingly, an area of a non-display-pixel area can be reduced. Thus, a high aperture ratio can be easily ensured. Further, firstly, the metal layer including the light-shield part which blocks light travelling toward the channel layer is provided. This suppresses deterioration of the channel layer formed of an oxide semiconductor, which is caused due to light. Thus, defective control of displaying which is caused due to deterioration of the channel layer is suppressed. Secondly, the metal layer, in conjunction with a part of the common electrode, forms a laminated structure. This laminated structure forms an electrical path having low resistance. As a result of this, a potential difference in the common electrode within the TFT substrate is reduced. Thus, unevenness in displaying of a display using the TFT substrate is suppressed. Based on the above-described matters, it is possible to suppress occurrence of defective displaying while ensuring an aperture ratio.

In the thin-film transistor substrate according to another aspect of the present invention, the common electrode need not be placed between the TFT and the pixel electrode formed of a transparent conductive material in a thickness direction. This can allow an electrical path between the TFT and the pixel electrode to be made shorter than that in a case where the common electrode is placed between the TFT and the pixel electrode. This can reduce an area of a contact hole forming the foregoing electrical path, while preventing electrical resistance of the electrical path from excessively increasing. Accordingly, an area of a non-display-pixel area can be reduced. Thus, a high aperture ratio can be easily ensured. Further, firstly, the metal layer including the light-shield part which blocks light travelling toward the channel layer is provided. This suppresses deterioration of the channel layer formed of an oxide semiconductor, which is caused due to light. Thus, defective control of displaying which is caused due to deterioration of the channel layer is suppressed. Secondly, the metal layer is electrically connected to the gate electrode. This can prevent a high electric field from being generated between the light-shield part included in the metal layer and the gate electrode. Accordingly, the channel layer placed between the light-shield part and the gate electrode can be prevented from being deteriorated due to a high electric field. Thus, defective control of displaying which is caused due to deterioration of the channel layer is further suppressed. Based on the above-described matters, it is possible to suppress occurrence of defective displaying while ensuring a sufficient aperture ratio.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a partial plan view schematically showing a configuration of each of a plurality of pixels included in the thin-film transistor substrate in FIG. 2;

FIG. 4 is a view in the same field of view as that in FIG. 3, and is a partial plan view schematically showing the configuration of each of the plurality of pixels while omitting showing of a part of members;

FIG. 7 is a schematical partial cross-sectional view taken along a line VII-VII in FIG. 6;

FIG. 11 is a partial cross-sectional view showing a modification of FIG. 10.

DESCRIPTION OF THE PREFERRED EMBODIMENTS

Figure 1:
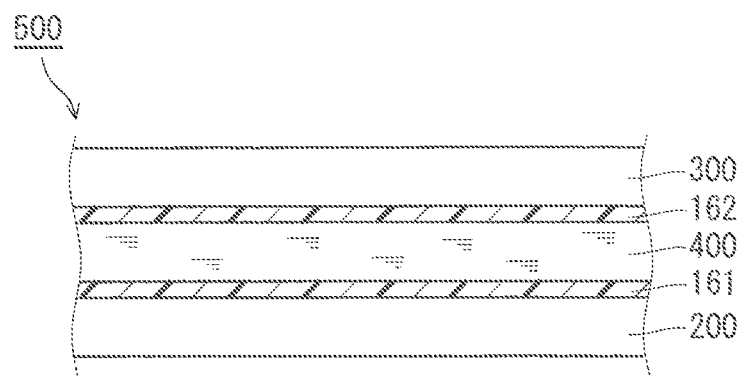
FIG. 1 is a partial cross-sectional view schematically showing a configuration of a liquid crystal display according to a first preferred embodiment of the present invention.

Below, preferred embodiments of the present invention will be described with reference to the drawings. It is noted that the drawings provide schematic representation, and do not reflect exact sizes and the like of components shown therein. Also, for the sake of brevity in the drawings, the part other than a principal part of the present invention is omitted and a part of a configuration is shown in a simplified manner, as needed. Further, in FIG. 2 and later, components which are identical or similar to components shown in the preceding drawings, are denoted by the same reference symbols, and description thereof will be omitted.

First Preferred Embodiment (Configuration of Liquid Crystal Display)

FIG. 1 is a partial cross-sectional view schematically showing a configuration of a liquid crystal display 500 according to a first preferred embodiment. The liquid crystal display 500 includes a TFT substrate 200 (thin-film transistor substrate), a color filter substrate 300 (counter substrate), a liquid crystal layer 400, an alignment layer 161, and an alignment layer 162. The color filter substrate 300 is placed at a distance from the TFT substrate 200. The liquid crystal layer 400 is held between the TFT substrate 200 and the color filter substrate 300. Each of the alignment layer 161 and the alignment layer 162 serves to cause alignment of the liquid crystal layer 400. The alignment layer 161 and the alignment layer 162 are provided on the TFT substrate 200 and the color filter substrate 300, respectively. In the first preferred embodiment, the liquid crystal display 500 is of a type for an FFS mode.

(Configuration of TFT Substrate)

Figure 2:
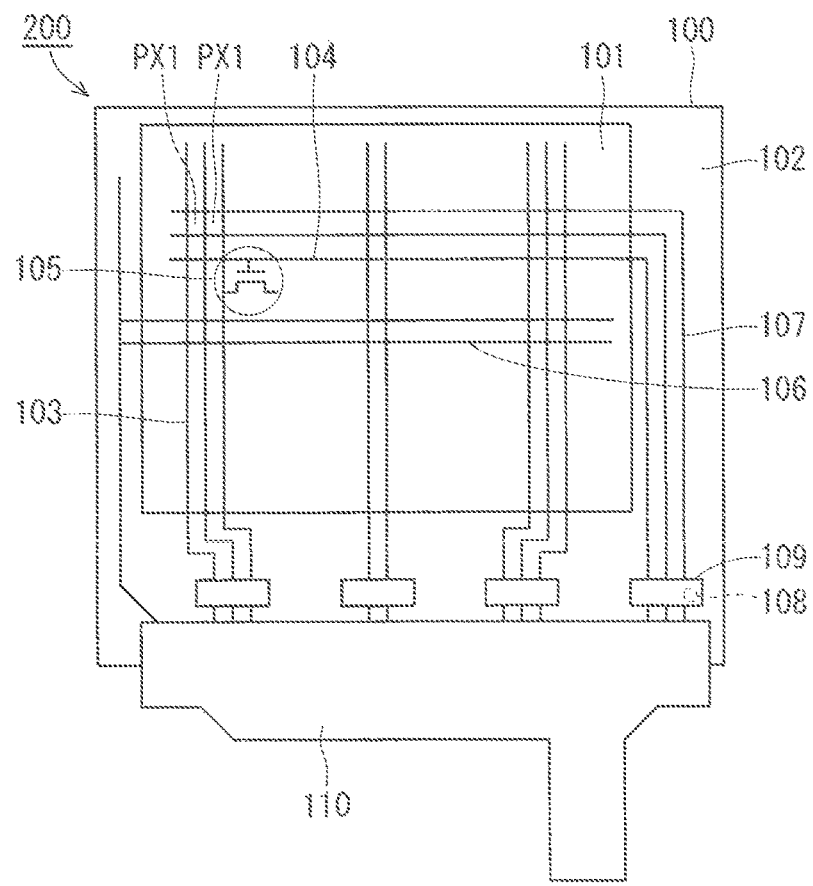
FIG. 2 is a plan view schematically showing a configuration of a thin-film transistor substrate in FIG. 1.

FIG. 2 is a plan view schematically showing a configuration of the TFT substrate 200. The TFT substrate 200 includes a display area 101 where an image is displayed, and a frame area 102 provided outside the display area 101. The frame area 102 surrounds the display area 101, typically, as shown in FIG. 2. Each of the alignment layers 161 and 162 (FIG. 1) is placed so as to include at least the display area 101 in plan view.

The TFT substrate 200 includes a plurality of external lines 107, a plurality of terminal electrodes 108, and a plurality of integrated circuit (IC) chips 109, all of which are placed in the frame area 102. It is noted that FIG. 2 shows only a single terminal electrode 108 for the sake of convenience of drawing. The external line 107 extends from each of a signal line 103 (source line) and a scanning line 104 (gate line) in the display area 101 to the frame area 102. The terminal electrode 108 is electrically connected to an end of the external line 107 and has a larger width than a width of the end of the external line 107. The terminal electrode 108 is a terminal used for external connection, and is placed so as to overlap external members such as the IC chip 109, a printed board 110, and the like in this preferred embodiment. As a result of this, the external members are electrically connected to the external line 107. A terminal of the IC chip 109 is electrically connected to the terminal electrode 108 via a bump or an anisotropic conductive film (ACF). Similarly, a terminal of the printed board 110 is electrically connected to the terminal electrode 108 via a bump or an ACF.

In the display area 101, a plurality of signal lines 103, a plurality of scanning lines 104, a plurality of TFTs 105 which are electrically connected to those lines, and a common line 106 are provided. The plurality of signal lines 103 and the plurality of scanning lines 104 are placed orthogonally to each other. One pixel PX1 is formed in each area which is surrounded by adjacent ones of the signal lines 103 and adjacent ones of the scanning lines 104. As a result of this, a plurality of pixels PX1 are arranged in a matrix. The TFT 105 is provided in each of the plurality of pixels PX1. Accordingly, the plurality of TFTs 105 are arranged in a matrix.

(Configuration and Function of Pixel)

Figure 5:
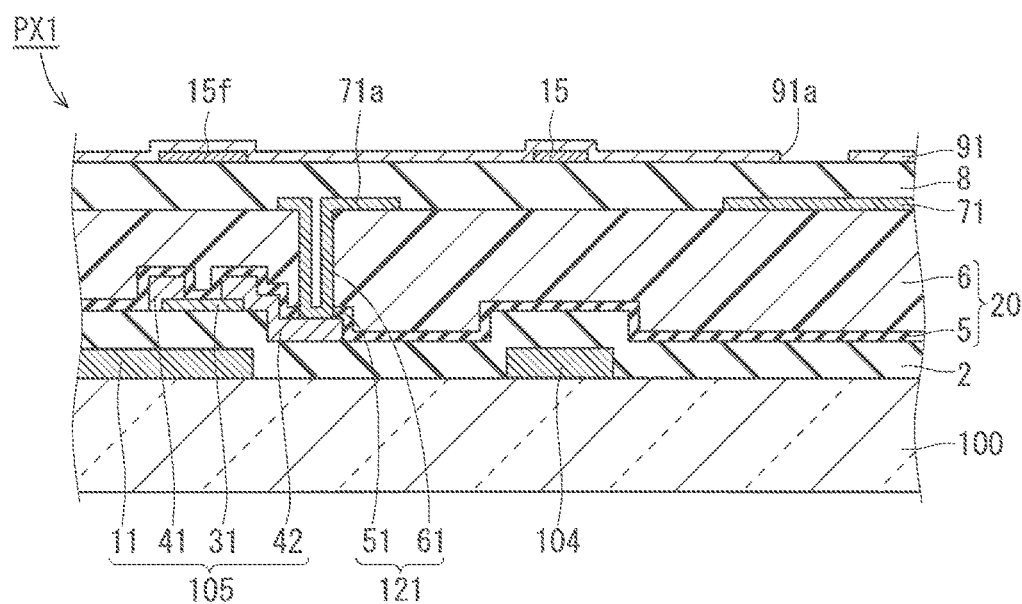
FIG. 5 is a schematical partial cross-sectional view taken along a line V-V in FIGS. 3 and 4.

FIG. 3 is a partial plan view schematically showing a configuration of each of the pixels PX1. FIG. 4 is a view in the same field of view as that in FIG. 3 and is a partial plan view schematically showing a configuration of each of the pixels PX1, while omitting showing of a part of members. FIG. 5 is a schematical partial cross-sectional view taken along a line V-V (FIGS. 3 and 4). It is noted that a metal layer 15 is shown with a dot pattern in FIG. 4 for increased visibility.

The TFT substrate 200 includes a transparent insulating substrate 100 (supporting substrate), the scanning lines 104, a gate insulating film 2, a channel layer 31, the signal lines 103, a drain electrode 42, an insulating film 20 (first insulating film), a pixel electrode 71, an interlayer insulating film 8 (second insulating film), a common electrode 91, and the metal layer 15.

The scanning lines 104 are provided on the transparent insulating substrate 100. In each of the pixels PX1, a partial area of the scanning lines 104 functions as a gate electrode 11. In other words, the scanning lines 104 include the gate electrodes 11 placed in the pixels PX1, respectively.

The scanning lines 104 are covered with the gate insulating film 2. As the gate insulating film 2, an SiN film, an SiO film, a laminated film of SiO and SiN, or the like is used, for example.

The channel layer 31 is provided like an island on each of the gate electrodes 11, via the gate insulating film 2. The channel layer 31 is formed of an oxide semiconductor. In general, an oxide semiconductor is likely to be deteriorated due to light.

The gate electrode 11, which is typically formed of a metal material such as Al, Cu, Ni, Ag, Nd, Mo, or Nb, has a light-shield property. Because of this light-shield property, light of a backlight is prevented from being incident upon the channel layer 31 from a lower side in FIG. 1, during operation of the liquid crystal display 500 (FIG. 1). In order to enhance the foregoing effect, it is preferable that the channel layer 31 be included in the gate electrode 11 in plan view.

The signal lines 103 (FIG. 4) are provided on the gate insulating film 2 (FIG. 5). In each of the pixels PX1, a partial area of the signal lines 103 functions as a source electrode 41. In other words, the signal lines 103 include the source electrodes 41 placed in the pixels PX1, respectively. Each of the source electrodes 41 is in contact with the channel layer 31 on one end of the channel layer 31.

The drain electrode 42 is placed in each of the pixels PX1. The drain electrode 42 is in contact with the channel layer 31 on the other end of the channel layer 31, and is distant from the source electrode 41. A portion of the channel layer 31, which is interposed between the source electrode 41 and the drain electrode 42, functions as a channel region of the TFT 105.

The insulating film 20 is provided so as to lie over the display area 101 (FIG. 2) and the frame area 102 (FIG. 2). In the display area 101, the insulating film 20 is provided on the channel layers 31, the signal lines 103, and the drain electrodes 42. In the insulating film 20, a drain contact hole 121 which reaches each of the drain electrodes 42 is provided.

The insulating film 20 includes a protective insulating film 5 and a flattening film 6 which is stacked on the protective insulating film 5. A contact hole 51 and a contact hole 61 are provided in the protective insulating film 5 and the flattening film 6, respectively. As a result of those contact holes being joined, the above-stated drain contact hole 121 is formed. In the frame area 102, the insulating film 20 is provided on the external lines 107. The gate insulating film 2 may extend between the insulating film 20 and the external lines 107.

As the protective insulating film 5, an inorganic insulating film such as an SiN film, a silicon oxide film (SiO film), or a laminated film of SiN and SiO is used, for example. To use an inorganic insulating film such as an SiN film, as the protective insulating film 5, could prevent characteristics of the TFT 105 from being degraded due to moisture or the like provided from the flattening film 6 or the like. In addition to the foregoing effect, because of high mechanical strength of an inorganic insulating film, an effect of making it difficult to be externally damaged can be achieved.

The flattening film 6 is placed on the TFT 105 via the protective insulating film 5. The flattening film 6 has an upper surface which is made flat. As the flattening film 6, an organic resin film may be used, for example. An organic resin has excellent flatness. Thus, in a case where an organic resin is applied as a material of the flattening film 6, a level difference (elevation difference) caused by a structure (such as the TFT 105) which is located below the flattening film 6 is hardly reflected in an upper surface of the flattening film 6. This allows the common electrode 91 as well as the pixel electrode 71 to be formed on a flat surface.

As the flattening film 6, an organic resin film mainly composed of acryl, or a spin-on-glass (SOG) film may be used, for example A relative dielectric constant of such a film as cited above is approximately 3 to 4, and is lower than a relative dielectric constant (6 to 7) of SiN. Accordingly, in a case where an acrylic resin or an SOG film is applied as the flattening film 6, a parasitic capacitance between the signal line 103 and a lower electrode (pixel electrode 71) is reduced. This lessens an influence of a noise provided from the signal line 103, upon the pixel electrode 71. Therefore, degradation in display quality due to a noise can be suppressed. Moreover, taking into account only lessening of an influence of a noise, it is conceivable to apply an SiO film having a dielectric constant which is comparable to a dielectric constant of an SOG film, as the flattening film 6. However, an SiO film is, like an SiN film, somewhat difficult to be flattened.

An organic resin film formed of a photosensitive material may be used as a material of the flattening film 6, for example. In such a case, an opening having a desired pattern can be formed in the flattening film 6 by photolithography. Accordingly, the contact hole 61 can be easily formed without etching. Then, by performing dry etching using the flattening film 6 having the contact hole 61 as an etching mask, it is possible to form the contact hole 51 in the protective insulating film 5.

The pixel electrodes 71 are provided on the flattening film 6 of the insulating film 20. The pixel electrodes 71 are in a pattern in which the pixel electrodes 71 are placed in the pixels PX1, respectively. The pixel electrodes 71 are formed of a transparent conductive material. As a transparent conductive material, an indium zinc oxide (IZO), an indium tin oxide (ITO), or the like is used, for example. The pixel electrode 71 includes a connection conductive layer 71a in addition to a plate electrode part. The connection conductive layer 71a is electrically connected to the drain electrode 42 by the drain contact hole 121. As a result of inclusion of the connection conductive layer 71a, the pixel electrode 71 is electrically connected to the drain electrode 42. Though the plate electrode part and the connection conductive layer 71a of the pixel electrode 71 appear to be separated from each other in FIG. 5, the plate electrode part and the connection conductive layer 71a of the pixel electrode 71 are joined to each other as shown in FIG. 4.

The interlayer insulating film 8 is provided on the pixel electrodes 71. The pixel electrodes 71 are covered with the interlayer insulating film 8.

The common electrode 91 is provided on the interlayer insulating film 8. The common electrode 91 is formed of a transparent conductive material. As a transparent conductive material, IZO, ITO, or the like is used, for example. The common electrode 91 and the pixel electrode 71 are partially superimposed upon each other in plan view. In each of the pixels PX1, the common electrode 91 includes a slit 91a (opening). The slit 91a faces the pixel electrode 71 via the interlayer insulating film 8 in a thickness direction. Upon application of a voltage between the pixel electrode 71 serving as a lower electrode and the common electrode 91 serving as an upper electrode, a fringe electric field is generated between the two electrodes. A fringe electric field comes out from the pixel electrode 71, develops upwardly via an opening of the slit 91a of the common electrode 91, further develops horizontally (in a transverse direction) within the liquid crystal layer 400 (FIG. 1) provided above the common electrode 91, and then still further develops toward the common electrode 91 located on a lower side. As such, a fringe electric field includes an electric field which is substantially horizontal to the transparent insulating substrate 100. This horizontal electric field drives a liquid crystal molecule in the liquid crystal layer 400 horizontally. As a result of this, a direction of polarization of light passing through the above-stated liquid crystal molecule is appropriately changed for each pixel. Thus, desired displaying in which the pixel PX1 is dealt with as one unit can be achieved in the display area 101 (FIG. 2).

Moreover, an area where the common electrode 91 (FIG. 3) and the pixel electrode 71 (FIG. 4) are superimposed upon each other is an area used for displaying in which the pixel PX1 is dealt with as one unit, namely, a display-pixel area 151 (FIG. 3). A light-shield film (black matrix) included in the color filter substrate 300 (FIG. 1) includes an opening in an area corresponding to the display-pixel area 151 in plan view. Also, the common electrode 91 lies over the plurality of pixels PX1, and so, the common electrode 91 also functions as the common line 106 (FIG. 2).

The gate electrode 11, the gate insulating film 2, the channel layer 31, the source electrode 41, and the drain electrode 42 form the TFT 105 on the transparent insulating substrate 100, below the pixel electrode 71 and the common electrode 91. Tuning-on/off of the TFT 105 is controlled by a voltage supplied to the gate electrode 11 from the scanning line 104. Also, a voltage is supplied to the source electrode 41 from the signal line 103, based on signal data which is externally input. With the foregoing configuration, a voltage which is supplied from the signal line 103 and is based on signal data can be applied selectively to the drain electrode 42 of a specific pixel PX1. A current (signal data) is transmitted to the pixel electrode 71 connected to the drain electrode 42. Signal data is controlled by the IC chip 109 and the printed board 110 which are connected to the terminal electrode 108 (FIG. 2). This control is performed based on display data which is externally input. In the above-described manner, displaying in each of the plurality of pixels PX1 is controlled based on display data which is externally input.

The metal layer 15, in conjunction with a part of the common electrode 91, forms a laminated structure. In an example shown in FIG. 5, the metal layer 15 is provided on the interlayer insulating film 8. The metal layer 15 is formed of a metal material. Terms, "a metal material" in this specification includes an alloy material. A metal material has generally an excellent light-shield property.

The metal layer 15 includes a light-shield part 15f. The light-shield part 15f and the channel layer 31 overlap each other at least partially in plan view, or preferably, the light-shield part 15f includes the channel layer 31 in plan view, as shown in FIG. 4. The light-shield part 15f can block light which is incident from above the channel layer 31. Accordingly, electrical characteristics of the TFT 105 formed of an oxide semiconductor layer can be prevented from varying. As light which is provided from above and travels toward the channel layer 31, irradiation light used in manufacture, diffracted light during operation of the liquid crystal display 500, or the like, can be cited. As light used in manufacture, ultraviolet (UV) light with which the TFT substrate 200 is irradiated during a cleaning process thereof, can be cited, for example.

In a case where an organic resin film, in particular, an organic resin film formed of a photosensitive organic resin, is used as the flattening film 6, the flattening film 6 tends to absorb a shorter wavelength of visible light and UV light. Such the flattening film 6 as stated above suppresses light incidence upon the channel layer 31 to a certain degree. However, in order to achieve more satisfactory suppression, the light-shield part 15f is required. In a case where an SOG film is used as the flattening film 6, unlike the case where an organic resin film is used, a shorter wavelength of visible light and UV light can easily pass through the flattening film 6. For this reason, without the light-shield part 15f, electrical characteristics of the TFT 105 using an oxide semiconductor layer would be likely to vary greatly. Thus, inclusion of the light-shield part 15f produces a significant effect.

The metal layer 15 is in contact with the common electrode 91. As a result of this, the metal layer 15, as well as the common electrode 91, forms the common line 106 (FIG. 1). Accordingly, electrical resistance of the common line 106 can be reduced. In a case where the metal layer 15 extends along the scanning line 104, electrical resistance of the common line 106 can be remarkably reduced. This can reduce a potential difference which arises between different positions in the common line 106 due to voltage drop. Thus, a voltage between the common electrode 91 and the pixel electrode 71 can be prevented from varying due to the above-stated potential difference. This suppresses variation among different ones of the pixels PX1 in fringe electric field generated in accordance with a voltage between the common electrode 91 and the pixel electrode 71. Therefore, unevenness in displaying in the liquid crystal display 500 can be reduced. Also, by reducing electrical resistance of the common line 106, it is possible to reduce also unevenness caused due to signal delay. As a material of the metal layer 15, a material having low resistivity is desirable, and a metal material such as Al, Ni, Mo, Nb, Ag, Nd, or Cu, or a metal alloy containing some of the above-stated metal materials, is used, for example.

The metal layer 15 and the scanning line 104 overlap each other at least partially in plan view. Accordingly, it is possible to ensure a large area for the metal layer 15 while keeping a proportion of the display-pixel area 151 (FIG. 3) in the display area 101 (FIG. 1), namely, an aperture ratio, high.

Considering only the above-described functions of the metal layer 15, the metal layer 15 may be placed on either an upper surface or a lower surface of the common electrode 91. However, when the metal layer 15 is provided on an upper surface of the common electrode 91, the metal layer 15 is located closer to the liquid crystal layer 400 (FIG. 1). This increases a possibility that the liquid crystal layer 400 and the metal layer 15 may come into contact with each other. If a metal of different kind is brought into contact with the liquid crystal layer 400, a direct-current voltage is applied to the liquid crystal layer 400 due to a contact potential difference. As a consequence, an adverse influence such as a change in composition of a liquid crystal material is given to the liquid crystal layer 400 in some cases. In order to prevent occurrence of such a phenomenon as described above, it is preferable that the metal layer 15 be placed on not an upper surface, but a lower surface, of the common electrode 91. In other words, it is preferable that the metal layer 15 be placed between the interlayer insulating film 8 and the common electrode 91.

(Summary of Effects)

According to the first preferred embodiment, as shown in FIG. 5, the common electrode 91 is placed above the pixel electrode 71. As a result of this, the common electrode 91 need not be placed between the TFT 105 and the pixel electrode 71 formed of a transparent conductive material in a thickness direction. This can allow an electrical path between the TFT 105 and the pixel electrode 71 to be made shorter than that in a case where the common electrode 91 is placed between the TFT 105 and the pixel electrode 71. This can reduce an area of a contact hole forming the foregoing electrical path, while preventing electrical resistance of the electrical path from excessively increasing. Accordingly, an area of a non-display-pixel area can be reduced. Thus, a high aperture ratio can be easily ensured. Further, firstly, the metal layer 15 including the light-shield part 15f which blocks light travelling toward the channel layer 31 is provided. This suppresses deterioration of the channel layer 31 formed of an oxide semiconductor, which is caused due to light. Thus, defective control of displaying which is caused due to deterioration of the channel layer 31 is suppressed. Secondly, the metal layer 15, in conjunction with a part of the common electrode 91, forms a laminated structure. This laminated structure forms an electrical path having low resistance. As a result of this, a potential difference in the common electrode 91 within the TFT substrate 200 is reduced. Thus, unevenness in displaying of a display using the TFT substrate 200 is suppressed. Based on the above-described matters, it is possible to suppress occurrence of defective displaying while ensuring a high aperture ratio.

Preferably, the metal layer 15 extends in a transverse direction in FIG. 4, that is, along the scanning line 104. This can significantly reduce electrical resistance of a current path which is associated with the common electrode 91 and extends along the scanning line 104, in other words, extends in a row direction of the TFT substrate 200 (FIG. 2). Thus, unevenness in displaying among the plurality of pixels PX1 in a row direction is suppressed.

Preferably, as shown in FIG. 4, the channel layer 31 is included in the gate electrode 11 in plan view. As a result of this, light travelling toward the channel layer 31 from the transparent insulating substrate 100 can be satisfactorily blocked by the gate electrode 11. Thus, deterioration of an oxide semiconductor which is caused due to light is suppressed. This further suppresses defective control of displaying which is caused due to deterioration of the channel layer 31 formed of an oxide semiconductor.

Preferably, as shown in FIG. 5, the metal layer 15 is placed between the interlayer insulating film 8 and the common electrode 91. As a result of this, the metal layer 15 is kept farther away from the liquid crystal layer 400 (FIG. 1). Thus, an adverse influence of a contact potential difference between the metal layer 15 and the liquid crystal layer 400 upon the liquid crystal layer 400 can be prevented.

The insulating film 20 can include an organic resin film. As a result of this, flatness of a surface of the insulating film 20 can be easily enhanced. Also, since the pixel electrode 71 and the signal line 103 are insulated from each other by an organic resin film having a relatively low dielectric constant, a parasitic capacitance between the pixel electrode 71 and the signal line 103 is reduced. This can suppress degradation in display quality, which is caused due to a noise provided to the pixel electrode 71 through the signal line 103.

The insulating film 20 can include an SOG film. As a result of this, flatness of a surface of the insulating film 20 can be easily enhanced. Also, since the pixel electrode 71 and the signal line 103 are insulated from each other by an organic resin film having a relatively low dielectric constant, a parasitic capacitance between the pixel electrode 71 and the signal line 103 is reduced. This can suppress degradation in display quality, which is caused due to a noise provided to the pixel electrode 71 through the signal line 103.

Second Preferred Embodiment

Figure 6:
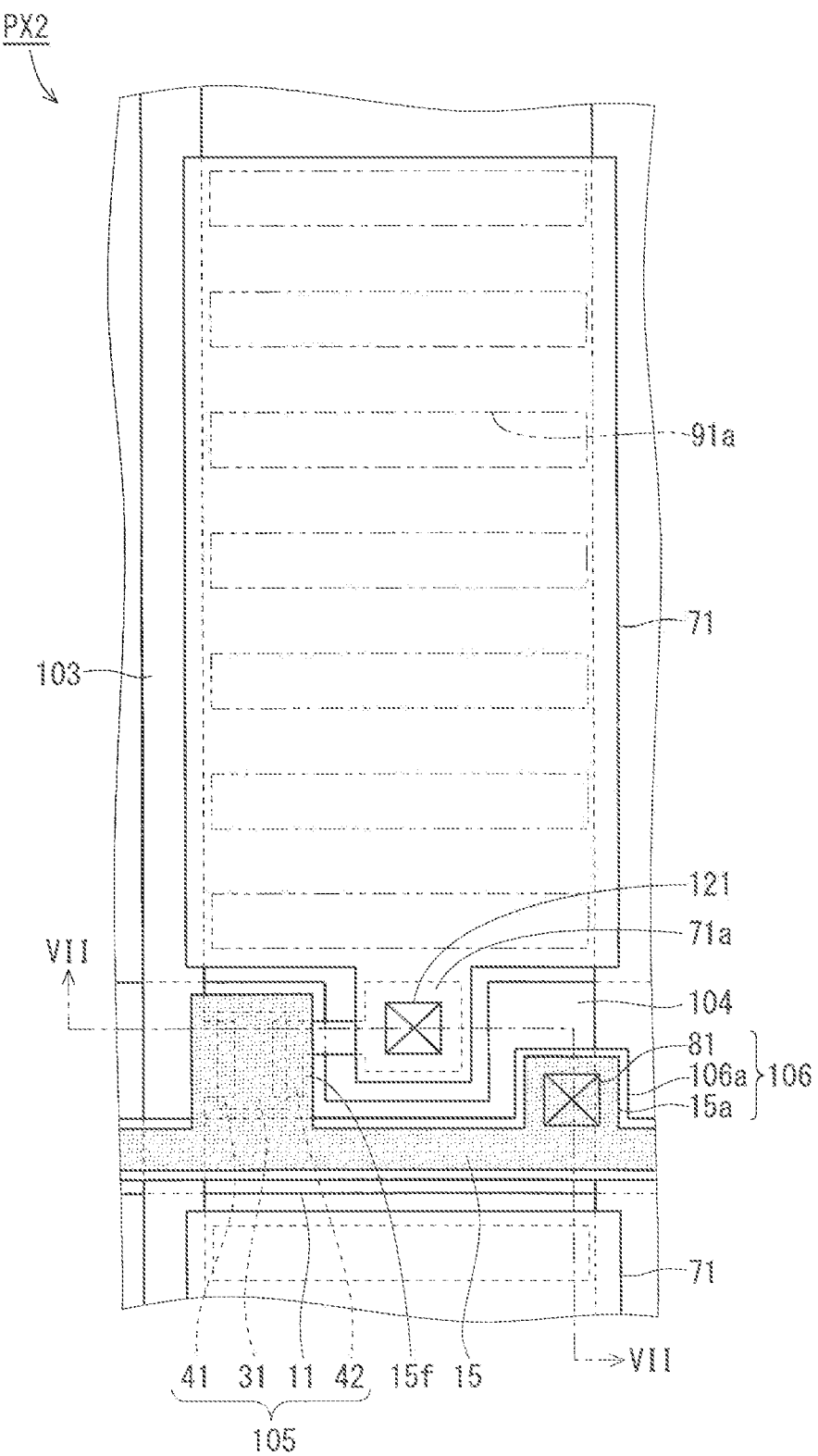
FIG. 6 is a partial plan view schematically showing a configuration of each of a plurality of pixels included in a thin-film transistor substrate according to a second preferred embodiment of the present invention while omitting showing of a part of members.

Referring to FIGS. 6 and 7, according to a second preferred embodiment, the TFT substrate 200 (FIGS. 1 and 2) includes a pixel PX2 in place of the pixel PX1 (FIGS. 4 and 5) described in the first preferred embodiment.

In the pixel PX2, the TFT substrate 200 includes a common transparent conductive layer 106a. The common transparent conductive layer 106a is placed on the insulating film 20. In other words, the common transparent conductive layer 106a is placed in the same layer as the pixel electrode 71. The common transparent conductive layer 106a is provided away from the pixel electrode 71. The common transparent conductive layer 106a is formed of a transparent conductive material. Preferably, the common transparent conductive layer 106a is formed of the same material that forms the pixel electrode 71. In such a case, the common transparent conductive layer 106a and the pixel electrode 71 can be formed simultaneously. This allows the common transparent conductive layer 106a to be formed without increasing the number of processes.

In the interlayer insulating film 8, a common-transparent-conductive-layer contact hole 81 which reaches the common transparent conductive layer 106a is provided. The metal layer 15 includes a connection metal layer 15a. The connection metal layer 15a is electrically connected to the common transparent conductive layer 106a by the common-transparent-conductive-layer contact hole 81. Thus, according to the second preferred embodiment, the common line 106 is formed of not only the common electrode 91 and the metal layer 15, but also the common transparent conductive layer 106a. As a result of this, electrical resistance of the common line 106 can be reduced. This further reduces a potential difference in the common electrode 91 within the TFT substrate 200. Thus, unevenness in displaying of a display using the TFT substrate 200 is further reduced.

It is preferable that the common transparent conductive layer 106a and the scanning line 104 overlap each other at least partially in plan view. As a result of this, it is possible to ensure a large area for the common transparent conductive layer 106a while keeping a proportion of the display-pixel area 151 (FIG. 3) in the display area 101 (FIG. 1), namely, an aperture ratio, high.

In a case where the common transparent conductive layer 106a and the channel layer 31 overlap each other at least partially in plan view, the channel layer 31 is interposed between the common transparent conductive layer 106a and the gate electrode 11 in a thickness direction. In this case, when a potential difference arises between the common transparent conductive layer 106a and the gate electrode 11, an electric field in a thickness direction (in a vertical direction in FIG. 7) is applied to the channel layer 31. If the applied electric field is large, the channel layer 31 may possibly be deteriorated. A large electric field is likely to be applied to the channel layer 31 particularly at a time when the common-transparent-conductive-layer contact hole 81 is formed in the interlayer insulating film 8 on the common transparent conductive layer 106a by dry etching. Thus, the channel layer 31 is likely to be deteriorated particularly at a time of dry etching. In order to avoid such deterioration of the channel layer 31 as described above, it is preferable that the common transparent conductive layer 106a be placed outside the channel layer 31 in plan view.

It is additionally noted that, in the other respects than described above, the configuration is substantially identical to the above-described configuration according to the first preferred embodiment. Thus, components which are identical or similar to each other are denoted by the same reference symbols, and description thereof is not repeated.

Third Preferred Embodiment (Configuration)

Figure 8:
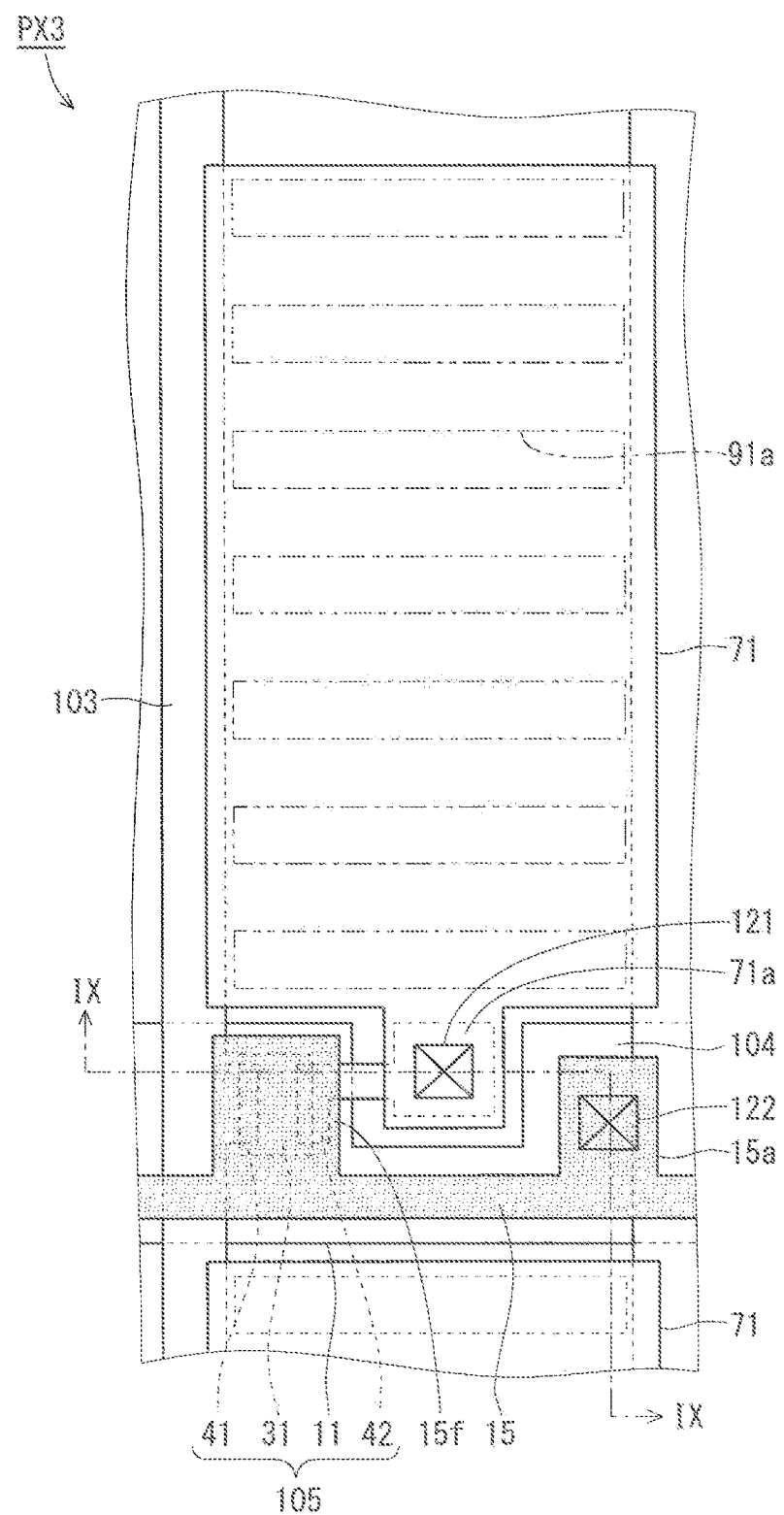
FIG. 8 is a partial plan view schematically showing a configuration of each of a plurality of pixels included in a thin-film transistor substrate according to a third preferred embodiment of the present invention while omitting showing of a part of members.
Figure 9:
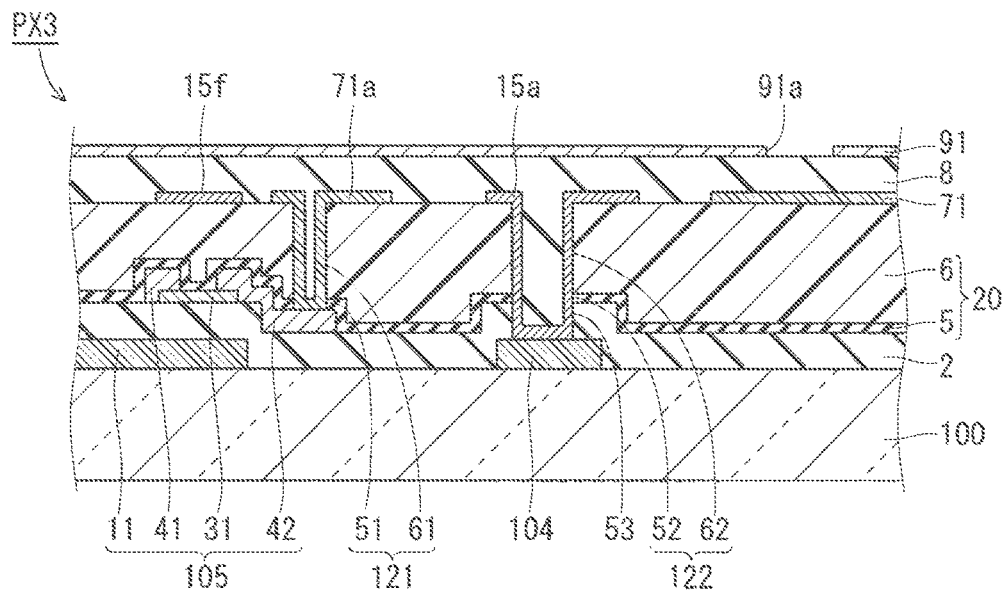
FIG. 9 is a schematical partial cross-sectional view taken along a line IX-IX in FIG. 8.

Referring to FIGS. 8 and 9, according to a third preferred embodiment, the TFT substrate 200 (FIGS. 1 and 2) includes a pixel PX3, in place of the pixel PX1 (FIGS. 4 and 5) described in the first preferred embodiment.

In the pixel PX3, a lower gate contact hole 53 (first gate contact hole) which reaches the scanning line 104 is provided in the gate insulating film 2. In the insulating film 20, an upper gate contact hole 122 (second gate contact hole) which is joined to the lower gate contact hole 53 is provided. The upper gate contact hole 122 is formed of the contact hole 52 and the contact hole 62 which are provided in the protective insulating film 5 and the flattening film 6, respectively.

According to the third preferred embodiment, the metal layer 15 is provided on a part of the flattening film 6 of the insulating film 20, as shown in FIG. 9. In other words, the metal layer 15 is placed in the same layer as the pixel electrode 71. The pixel electrode 71 and the metal layer 15 are covered with the interlayer insulating film 8. Moreover, the light-shield part 15f included in the metal layer 15 is placed in the same manner as that in the first preferred embodiment, in plan view.

The metal layer 15 includes the connection metal layer 15a. The connection metal layer 15a passes through the lower gate contact hole 53 and the upper gate contact hole 122, and reaches the scanning line 104. In other words, the metal layer 15 is electrically connected to the scanning line 104 by the lower gate contact hole 53 and the upper gate contact hole 122.

It is noted that, in the other respects than described above, the configuration is substantially identical to the above-described configuration according to the first preferred embodiment. Thus, components which are identical or similar to each other are denoted by the same reference symbols, and description thereof is not repeated.

(Effects)

According to the third preferred embodiment, like the first preferred embodiment, the common electrode 91 need not be placed between the TFT 105 and the pixel electrode 71 formed of a transparent conductive material in a thickness direction. As a result of this, an electrical path between the TFT 105 and the pixel electrode 71 can be made shorter than that in a case where the common electrode 91 is placed between the TFT 105 and the pixel electrode 71. This can reduce an area of a contact hole which forms the foregoing electrical path, while preventing electrical resistance of the electrical path from excessively increasing. Accordingly, an area of a non-display-pixel area can be reduced. Thus, a high aperture ratio can be easily ensured. Further, the metal layer 15 including the light-shield part 15f which blocks light travelling toward the channel layer 31 is provided. This suppresses deterioration of the channel layer 31 formed of an oxide semiconductor, which is caused due to light. Thus, defective control of displaying which is caused due to deterioration of the channel layer 31 is suppressed. Based on the above-described matters, it is possible to suppress occurrence of defective displaying, while ensuring a high aperture ratio.

Further, according to the third preferred embodiment, the metal layer 15 is electrically connected to the scanning line 104. That is, the metal layer 15 and the scanning line 104 are electrically short-circuited to each other. As a result of this, generation of a high electric field between the light-shield part 15f included in the metal layer 15 and the gate electrode 11 included in the scanning line 104 can be avoided. Accordingly, the channel layer 31 placed between the light-shield part 15f and the gate electrode 11 is prevented from being deteriorated due to a high electric field. This further suppresses defective control of displaying which is caused due to deterioration of the channel layer 31. Supposing that the metal layer 15 is not electrically connected to the gate electrode 11, a potential difference can possibly arise between the metal layer 15 and the gate electrode 11 for some reasons during manufacture or usage of the TFT substrate 200. In such a case, an electric field in a thickness direction (in a vertical direction in FIG. 9) is applied to the channel layer 31 placed between the light-shield part 15f of the metal layer 15 and the gate electrode 11. If the applied electric field is large, the channel layer 31 can possibly be deteriorated.

Preferably, the metal layer 15 extends along the scanning line 104. This can reduce electrical resistance of a current path which is associated with the scanning line 104 and extends along the scanning line 104, in other words, extends in a row direction. Accordingly, a potential difference among the scanning lines 104 in the TFT substrate 200 and a signal delay of the scanning line 104 are reduced. Thus, unevenness in displaying among the plurality of pixels PX3 in a row direction is reduced.

(Modifications)

According to the above-described third preferred embodiment, as shown in FIGS. 8 and 9, the pixel electrode 71 and the metal layer 15 are placed so as not to overlap each other.

In a first modification, the metal layer 15 can include a connection metal layer stacked on the connection conductive layer 71a, in addition to the connection metal layer 15a. This reduces contact resistance with respect to the drain electrode 42. Accordingly, a displaying property can be further improved. Moreover, in order to prevent the scanning line 104 and the pixel electrode 71 from being short-circuited to each other, the additional connection metal layer should be separated from the connection metal layer 15a.

In a second modification, a connection conductive layer which is formed of the same transparent conductive material that forms the pixel electrode 71, and is stacked on the connection metal layer 15a, may be provided. This reduces contact resistance with respect to the scanning line 104. Accordingly, a displaying property can be further improved. Moreover, in order to prevent the scanning line 104 and the pixel electrode 71 from being short-circuited to each other, the additional connection conductive layer should be separated from the pixel electrode 71. The second modification may be combined with the above-described first modification.

Fourth Preferred Embodiment

According to a fourth preferred embodiment, the alignment layer 161 (FIG. 1) is formed of a material having a photo-alignment property. In such a case, a method of manufacturing the liquid crystal display 500 includes a process of forming the alignment layer 161 formed of a material having a photo-alignment property on the TFT substrate 200, and a process of carrying out photo-alignment treatment on the alignment layer 161. To carry out photo-alignment treatment changes an alignment state of a surface of the alignment layer 161 to a desired state. Photo-alignment treatment is carried out in such a manner that, after the alignment layer 161 is formed on an upper surface of the TFT substrate 200, the alignment layer 161 is irradiated with UV light from above or obliquely from above, for example. It is noted that, in the other respects than described above, the configuration is substantially identical to the above-described configurations according to the first to third preferred embodiments.

According to the fourth preferred embodiment, in photo-alignment treatment, light travelling toward the channel layer 31 is blocked by the light-shield part 15f. This suppresses deterioration of the channel layer 31 formed of an oxide semiconductor, which is caused due to light, as compared to a case where the light-shield part 15f is not provided. Accordingly, defective control of displaying which is caused due to deterioration of the channel layer 31 is suppressed.

Fifth Preferred Embodiment (Configuration)

Figure 10:
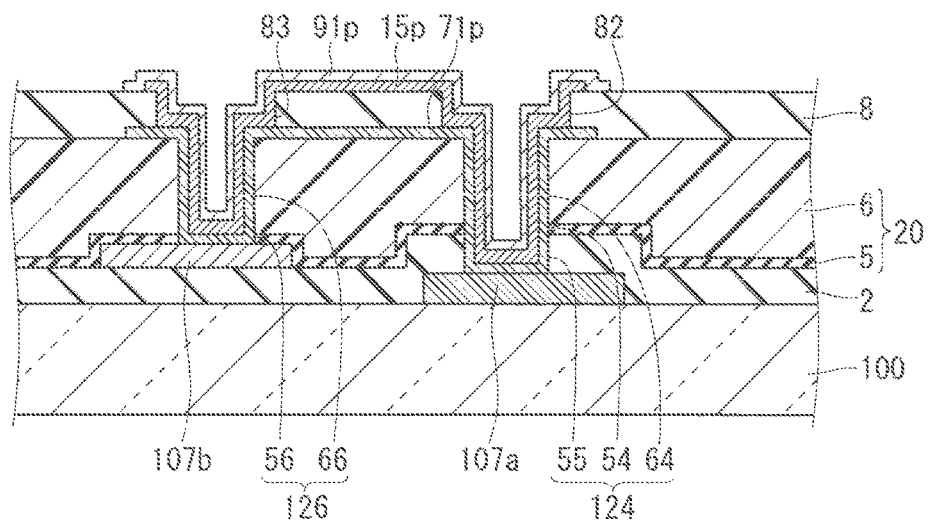
FIG. 10 is a partial cross-sectional view schematically showing a configuration of a frame area of a thin-film transistor substrate according to a fifth preferred embodiment of the present invention.

Referring to FIG. 10, the external line 107 (FIG. 2) typically includes an external gate line 107a (first line) and an external source line 107b (second line). The external gate line 107a is placed on the transparent insulating substrate 100. In other words, the external gate line 107a is placed in the same layer as the scanning line 104. The external gate line 107a is formed of the same material that forms the scanning line 104. Accordingly, the external gate line 107a can be formed simultaneously with the scanning line 104. The external source line 107b is placed on the gate insulating film 2. In other words, the external source line 107b is placed in the same layer as the signal line 103. The external source line 107b is formed of the same material that forms the signal line 103. Accordingly, the external source line 107b can be formed simultaneously with the signal line 103. Because of the configuration of the external line 107, the external gate line 107a and the external source line 107b are electrically connected to each other in the frame area 102 (FIG. 2) in some cases. The fifth preferred embodiment will discuss such cases.

According to the fifth preferred embodiment, in the frame area 102, a contact hole 55 is provided in the gate insulating film 2, and a contact hole 54 and a contact hole 56 are provided in the protective insulating film 5. Also, a contact hole 64 and a contact hole 66 are provided in the flattening film 6. The contact hole 64, the contact hole 54, and the contact hole 55 are joined to each other, to thereby form an external gate contact hole 124 (first contact hole) passing through the insulating film 20 and the gate insulating film 2. The contact hole 66 and the contact hole 56 are joined to each other, to thereby form an external source contact hole 126 (second contact hole) passing through the insulating film 20.

The metal layer 15 includes a connection metal layer 15p placed within the frame area 102. The connection metal layer 15p is electrically connected to the external gate line 107a by the external gate contact hole 124, and is electrically connected to the external source line 107b by the external source contact hole 126. As a result of this, the external gate line 107a and the external source line 107b are electrically connected to each other. According to the fifth preferred embodiment, like the first or second preferred embodiment, the metal layer 15 is placed on the interlayer insulating film 8. To this end, a contact hole 82 and a contact hole 83 which are joined to the external gate contact hole 124 and the external source contact hole 126, respectively, are provided in the interlayer insulating film 8.

A connection conductive layer 71p may be provided in the frame area 102. The connection conductive layer 71p is placed on the insulating film 20. In other words, the connection conductive layer 71p is placed in the same layer as the pixel electrode 71 (FIG. 5 or FIG. 7). Also, the connection conductive layer 71p can be formed of the same transparent conductive material that forms the pixel electrode 71. Accordingly, the connection conductive layer 71p can be formed simultaneously with the pixel electrode 71. By stacking the connection conductive layer 71p on the connection metal layer 15p in the external gate contact hole 124, it is possible to reduce contact resistance. By stacking the connection conductive layer 71p on the connection metal layer 15p in the external source contact hole 126, it is possible to reduce contact resistance. Respective parts of the connection conductive layer 71p, which are placed in the external gate contact hole 124 and the external source contact hole 126, are not necessarily required to be joined to each other. However, in a case where the parts are joined to each other as shown in the figure, electrical resistance between the external gate line 107a and the external source line 107b can be further reduced.

A connection conductive layer 91p may be provided in the frame area 102. The connection conductive layer 91p is placed on the interlayer insulating film 8. In FIG. 10, the connection conductive layer 91p is placed on a part of the interlayer insulating film 8, where the connection metal layer 15p is provided. In other words, the connection conductive layer 91p is placed in the same layer as the common electrode 91 (FIG. 5 or FIG. 7). Also, the connection conductive layer 91p can be formed of the same transparent conductive material that forms the common electrode 91. Accordingly, the connection conductive layer 91p can be formed simultaneously with the common electrode 91. By stacking the connection conductive layer 91p on the connection metal layer 15p in the external gate contact hole 124 and the contact hole 82, it is possible to reduce contact resistance. By stacking the connection conductive layer 91p on the connection metal layer 15p in the external source contact hole 126 and the contact hole 83, it is possible to reduce contact resistance. Respective parts of the connection conductive layer 91p, which are placed in the external gate contact hole 124 and the external source contact hole 126, are not necessarily required to be joined to each other. However, in a case where the parts are joined to each other as shown in the drawings, electrical resistance between the external gate line 107a and the external source line 107b can be further reduced.

It is noted that, in the other respects than described above, the configuration is substantially identical to the above-described configuration according to the first or second preferred embodiment. Thus, components which are identical or similar to each other are denoted by the same reference symbols, and description thereof is not repeated.

(Effects)

According to the fifth preferred embodiment, the external gate line 107a and the external source line 107b are connected to each other by the connection metal layer 15p. The connection metal layer 15p is formed of a metal which is a material having generally lower resistivity than resistivity of a transparent conductive material. This allows the external gate line 107a and the external source line 107b to be connected to each other with low resistance. Accordingly, line resistance and signal delay of the external line 107 including the external gate line 107a and the external source line 107b can be reduced. In other words, line resistance and signal delay of the external line 107 which extends to the display area 101 can be reduced. Thus, a displaying property can be improved.

Moreover, the connection metal layer 15p placed in the frame area 102 (FIG. 2) can be formed simultaneously with the other part of the metal layer 15. Accordingly, an increase in the number of processes, which may otherwise occur due to inclusion of the connection metal layer 15p, can be avoided.

(First Modification)

At least parts of a component which function similarly to the external line 107 (FIG. 2) may be placed dispersedly within the display area 101. This is applied to a case where driving circuits are dispersedly placed within the display area 101, for example. In this case, the above-described connection metal layer 15p can be placed in not the frame area 102 but the display area 101, or can be placed in both of the frame area 102 and the display area 101.

(Second Modification)

The above-described fifth preferred embodiment has discussed a case where the connection metal layer 15p (FIG. 10) is applied to the configuration according to the first or second preferred embodiment (FIG. 5 or 7). Meanwhile, the connection metal layer 15p (FIG. 11) according to the present modification can be applied to the configuration according to the third preferred embodiment (FIG. 9). In this case, the connection metal layer 15p (FIG. 11) of the metal layer 15, together with the connection metal layer 15a and the light-shield part 15f (FIG. 9), is placed on the flattening film 6 of the insulating film 20. Accordingly, so far as placement of the connection metal layer 15p is concerned, the contact hole 82 and the contact hole 83 in the interlayer insulating film 8 are not necessarily required. However, those contact holes should be required in a case where the connection conductive layer 91p is provided.

(Third Modification)

An electronic circuit having function of the IC chip 109 (FIG. 2) can be formed in the frame area 102 with the use of processes similar to manufacturing processes of the TFT 105. The external gate line 107a and the external source line 107b can be used as lines in the foregoing electronic circuit. This reduces line resistance and signal delay in the foregoing electronic circuit. Accordingly, a displaying property can be improved.

While each of the above-described preferred embodiments has discussed in detail a case where an FFS mode which is of a general type as a mode of driving liquid crystal is used, any mode other than an FFS mode which is of a general type may be used. Also, while each of the above-described preferred embodiments has discussed in detail a case where a liquid crystal display is used as a display to which a TFT substrate is applied, a TFT substrate may be applied to any display other than a liquid crystal display.

The present invention allows any arbitrary combination of the preferred embodiments, and appropriate modification and omission of each of the preferred embodiments, within the scope of the invention.

What is claimed is:

1. A thin-film transistor substrate which includes a display area having a plurality of pixels which are arranged in a matrix, comprising:
   a supporting substrate;
   a gate line which is provided on said supporting substrate and includes a gate electrode placed in each of said pixels;
   a gate insulating film with which said gate line is covered;
   a channel layer which is provided on each of said gate electrodes via said gate insulating film and is formed of an oxide semiconductor;
   a source line which is placed in each of said pixels and includes a source electrode which is in contact with said channel layer;
   a drain electrode which is placed in each of said pixels, and is in contact with said channel layer, said drain electrode being distant from said source electrode;
   a first insulating film which is provided on said channel layer, said source line, and said drain electrode, and includes a drain contact hole which reaches said drain electrode;
   a pixel electrode which is provided on said first insulating film in each of said pixels, and includes a connection conductive layer electrically connected to said drain electrode by said drain contact hole, said pixel electrode being formed of a transparent conductive material;
   a second insulating film with which said pixel electrode is covered;
   a common electrode which is provided on said second insulating film, and includes an opening facing said pixel electrode in a thickness direction, said common electrode being formed of a transparent conductive material; and
   a metal layer which forms a laminated structure in conjunction with a part of said common electrode, and includes a light-shield part which overlaps said channel layer at least partially in plan view, wherein said metal layer is provided on a part of said first insulating film in a same layer as said pixel electrode, and said metal layer is covered with said second insulating film.

2. The thin-film transistor substrate according to claim 1, wherein said metal layer extends along said gate line.

3. The thin-film transistor substrate according to claim 1, wherein said gate electrode overlaps said channel layer in plan view.

4. The thin-film transistor substrate according to claim 1, wherein said first insulating film includes an organic resin film.

5. The thin-film transistor substrate according to claim 1, wherein said second insulating film includes a spin-on-glass film.

6. The thin-film transistor substrate according to claim 1, further comprising:

a first line which is provided on said supporting substrate and is formed of the same material that forms said gate line; and a second line which is provided on said gate insulating film and is formed of the same material that forms said source line, wherein said metal layer includes a connection metal layer, and said connection metal layer is electrically connected to said first line by a first contact hole which passes through said first insulating film and said gate insulating film, and is electrically connected to said second line by a second contact hole which passes through said first insulating film, so that said first line and said second line are electrically connected to each other.

7. The thin-film transistor substrate according to claim 6, wherein said thin-film transistor substrate includes a frame area provided outside said display area, and said connection metal layer is placed within said frame area.

8. A liquid crystal display comprising:

the thin-film transistor substrate according to claim 1;

a counter substrate placed at a distance from said thin-film transistor substrate; and a liquid crystal layer held between said thin-film transistor substrate and said counter substrate.

9. The liquid crystal display according to claim 8, further comprising an alignment layer which is provided on said thin-film transistor substrate and causes alignment of said liquid crystal layer, wherein said alignment layer is formed of a material having a photo-alignment property.

10. The thin-film transistor substrate according to claim 1, wherein said gate insulating film includes a first gate contact hole which reaches said gate line, said first insulating film includes a second gate contact hole which is joined to said first gate contact hole, said metal layer is electrically connected to said gate line by said first gate contact hole and said second gate contact hole.

11. A thin-film transistor substrate which includes a display area having a plurality of pixels which are arranged in a matrix, comprising:

a supporting substrate;

a gate line which is provided on said supporting substrate and includes a gate electrode placed in each of said pixels;

a gate insulating film with which said gate line is covered;

a channel layer which is provided on each of said gate electrodes via said gate insulating film and is formed of an oxide semiconductor;

a source line which is placed in each of said pixels and includes a source electrode which is in contact with said channel layer;

a drain electrode which is placed in each of said pixels, and is in contact with said channel layer, said drain electrode being distant from said source electrode;

a first insulating film which is provided on said channel layer, said source line, and said drain electrode, and includes a drain contact hole which reaches said drain electrode;

a pixel electrode which is provided on said first insulating film in each of said pixels, and includes a connection conductive layer electrically connected to said drain electrode by said drain contact hole, said pixel electrode being formed of a transparent conductive material;

a second insulating film with which said pixel electrode is covered;

a common electrode which is provided on said second insulating film, and includes an opening facing said pixel electrode in a thickness direction, said common electrode being formed of a transparent conductive material; and a metal layer which forms a laminated structure in conjunction with a part of said common electrode, wherein said metal layer includes a light-shield part which overlaps said channel layer at least partially in plan view, and said metal layer includes a connection metal layer stacked directly on said connection conductive layer.

12. A thin-film transistor substrate which includes a display area having a plurality of pixels which are arranged in a matrix, comprising:

a supporting substrate;

a gate line which is provided on said supporting substrate and includes a gate electrode placed in each of said pixels;

a gate insulating film with which said gate line is covered;

a channel layer which is provided on each of said gate electrodes via said gate insulating film and is formed of an oxide semiconductor;

a source line which is placed in each of said pixels and includes a source electrode which is in contact with said channel layer;

a drain electrode which is placed in each of said pixels, and is in contact with said channel layer, said drain electrode being distant from said source electrode;

a first insulating film which is provided on said channel layer, said source line, and said drain electrode, and includes a drain contact hole which reaches said drain electrode;

a pixel electrode which is provided on said first insulating film in each of said pixels, and includes a connection conductive layer electrically connected to said drain electrode by said drain contact hole, said pixel electrode being formed of a transparent conductive material;

a second insulating film with which said pixel electrode is covered;

a common electrode which is provided on said second insulating film, and includes an opening facing said pixel electrode in a thickness direction, said common electrode being formed of a transparent conductive material;

a metal layer which forms a laminated structure in conjunction with a part of said common electrode, and includes a light-shield part which overlaps said channel layer at least partially in plan view;

a first line which is provided on said supporting substrate and is formed of the same material that forms said gate line; and a second line which is provided on said gate insulating film and is formed of the same material that forms said source line, wherein said metal layer includes a connection metal layer, and said connection metal layer is electrically connected to said first line by a first contact hole which passes through said first insulating film and said gate insulating film, and is electrically connected to said second line by a second contact hole which passes through said first insulating film, so that said first line and said second line are electrically connected to each other.

* * * * *